(12) United States Patent
Chiu et al.

(10) Patent No.: US 9,384,313 B2
(45) Date of Patent: Jul. 5, 2016

(54) SYSTEMS AND METHODS FOR INCREASING DEBUGGING VISIBILITY OF PROTOTYPING SYSTEMS

(71) Applicants: Synopsys, Inc., Mountain View, CA (US); Synopsys Taiwan Co., Ltd., Taipei (TW)

(72) Inventors: Hung Chun Chiu, Fremont, CA (US); Meng-Chyi Lin, Miaoli County (TW); Kuen-Yang Tsai, Hsinchu (TW); Sweyyan Shei, Cupertino, CA (US); Hwa Mao, Taipei (TW); Yingtsai Chang, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/253,784

(22) Filed: Apr. 15, 2014

(65) Prior Publication Data

US 2015/0294055 A1 Oct. 15, 2015

Related U.S. Application Data

(63) Continuation of application No. 13/596,069, filed on Aug. 28, 2012, now Pat. No. 8,739,089.

(60) Provisional application No. 61/528,733, filed on Aug. 29, 2011.

(51) Int. Cl.
*G06F 17/50* (2006.01)
(52) U.S. Cl.
CPC ........ *G06F 17/5054* (2013.01); *G06F 2217/14* (2013.01)

(58) Field of Classification Search
USPC ........................................................ 716/104
See application file for complete search history.

(56) References Cited

U.S. PATENT DOCUMENTS

| 6,823,497 | B2 | 11/2004 | Schubert et al. | |
|---|---|---|---|---|
| 7,065,481 | B2 | 6/2006 | Schubert et al. | |
| 7,240,303 | B1 | 7/2007 | Schubert et al. | |
| 7,827,510 | B1 | 11/2010 | Schubert et al. | |
| 2004/0139413 | A1* | 7/2004 | DeHon et al. | 716/9 |
| 2008/0250378 | A1* | 10/2008 | Chen et al. | 716/16 |
| 2013/0055177 | A1* | 2/2013 | Chiu et al. | 716/104 |

OTHER PUBLICATIONS

Non-Final Office Action for U.S. Appl. No. 13/596,069 mailed Jul. 9, 2013.
Notice of Allowance for U.S. Appl. No. 13/596,069 mailed Jul. 15, 2014.

* cited by examiner

*Primary Examiner* — Mohammed Alam
(74) *Attorney, Agent, or Firm* — Alston & Bird LLP

(57) ABSTRACT

User's register transfer level (RTL) design is analyzed and instrumented so that signals of interest are preserved and can be located in the netlist after synthesis. Then, the user's original flow of RTL synthesis and design partition is performed. The output is analyzed to locate the signals of interest. Latches are selectively inserted to the netlist to ensure that signal values can be accessed at runtime. After that, a place and route (P&R) process is performed, and the outputs are analyzed to correlate signal names to registers (flip-flops and latches) or memory blocks locations is field programmable gate array (FPGA) devices. A correlation database is built and kept for runtime use. During runtime, a software component may be provided on a workstation for the user to query signal values corresponding to RTL hierarchical signal names.

10 Claims, 7 Drawing Sheets

```
module m1 ( p1, p2, p3)                           301
wire p1, p2, p3;
input p1, p2;
output p3;
reg r1, r2;
endmodule
```

```
module dummy001 ( dummy_s1, dummy_s2)             302
wire dummy_s1, dummy_s2;
endmodule module m1 ( p1, p2, p3)
wire p1, p2, p3;
input p1, p2;
output p3;
reg r1, r2;
dummy001 dummy_001_i (.dummy_s1(r1), .dummy_s2(r2));
endmodule
```

```
dummy_001 "top.m1_i"                              303
dummy_s1 "top.m1_i.r1"
dummy_s1 "top.m1_i.r2"
```

Fig. 3

```
inst "USIG[223]"... placed CLBLL_X4Y119 SLICE_X7Y119       501
inst "USIG[227]"... placed CLBLL_X2Y119 SLICE_X3Y119
inst "USIG[231]"... placed CLBLL_X3Y119 SLICE_X4Y119
```

```
net "USIG[223]",                                          502 outpin "USIG[223]" DQ,
    inpin "USIG[227]" AX,
```

```
net "USIG[227]",                                          503 outpin "USIG[227]" DQ,
    inpin "USIG[231]" AX,
```

Fig. 5

SYSTEMS AND METHODS FOR INCREASING DEBUGGING VISIBILITY OF PROTOTYPING SYSTEMS

CROSS REFERENCE TO RELATED APPLICATIONS

This application is a continuation of U.S. patent application Ser. No. 13/596,069, filed on Aug. 28, 2012 and entitled "SYSTEMS AND METHODS FOR INCREASING DEBUGGING VISIBILITY OF PROTOTYPING SYSTEMS", which application claims the benefit of priority to U.S. Provisional Patent Application No. 61/528,733, filed on Aug. 29, 2011 and entitled "SYSTEMS AND METHODS FOR INCREASING DEBUGGING VISIBILITY OF PROTOTYPING SYSTEMS", the contents of which are incorporated herein by reference in their entirety.

BACKGROUND OF THE INVENTION

1. Field of the Invention

The present invention relates in general to a computer-implemented method for debugging a RTL design, and in particular, to a method for debugging a RTL design in an emulation or co-emultion system.

2. Description of the Prior Art

For debugging purposes, it is generally known that emulation and prototyping systems may use logic analyzers to capture signal values at runtime. However, the number of signals that can be captured is limited, typically in the range of tens to hundreds of signals. Given the complexity of today's design, IC designers may need to know the values of most, if not all, signals during debugging. This provides a "full visibility" for debugging or other purposes. Using various techniques, turn-key emulation and prototyping systems may offer full visibility for debugging. For many IC designers, however, they prefer their own in-house prototyping systems over turn-key systems, because the former are tailored to their needs. Furthermore, depending on the designs and systems, certain turn-key systems may be costly, time-consuming, and/or error-prone.

FIG. 1 shows a general flow for in-house built FPGA-based prototyping system. To start, user's RTL design 100 is synthesized into a gate level netlist (block 101). The gate level netlist is then fitted into an emulation system (block 102), which includes one or more FPGA devices. The gate level netlist will be partitioned into multiple netlists, if necessary, so that each can fit in an FPGA device. The partitioned netlist is typically expressed in an industry standard netlist format, such as EDIF. Finally, P&R tools are run to convert each partitioned netlist into an image that can be downloaded to an FPGA device for emulating the design (block 103).

In order to debug a RTL design in an FPGA-based emulation system while considering the limited resources in the emulation system, one must determine what signals in the RTL design are most relevant or essential for trouble-shooting a particular bug. However, all the signal names in RTL are in a hierarchical form which is not efficient for synthesizing and fitting process later on; therefore, it is more convenient to maintain the signal names in a flattened form to cut short the length of each signal name to speed up the synthesizing and fitting process. Since there in no direct meaning in names of gate-level signals, names of gate-level signals are not readable and correlated to signals names in a RTL design after synthesizing.

Therefore, what is needed is a solution to provide full or improved visibility of signals in a RTL design when the RTL design is debugged using an emulation system.

SUMMARY OF THE INVENTION

One object of the present invention is to instrument a RTL design by inserting dummy modules for correlating signals of the RTL design to corresponding gate-level signals for fitting into an emulation system, wherein the RTL signals can be traced and debugged by reading back the corresponding gate-level signals in the emulation system.

One embodiment in the present invention is to provide a method to instrument a RTL design by inserting dummy modules for correlating interesting signals of the RTL design to corresponding gate-level signals, wherein the instrumented RTL design is synthesized so generate a gate-level netlist targeting for an emulation system. The gate-level netlist is then fitted into the emulation system and location information of instances of the gate-level netlist in the emulation system will be generated. Then, values of gate-level signals of the emulation system corresponding to the interesting signals of the RTL design are extracted during an emulation or co-emulation run for debugging the RTL design.

The synthesized gate-level netlist can be inserted with a latch, which is always enabled, for latching a combinatorial signal of the interesting signals to ensure that those corresponding gate level signals are located at registers output, latches output, or memory blocks, and their values can be read back at runtime.

In addition, the interesting signals of the RTL design can include essential signals which are generated by analyzing the RTL design, wherein values of other non-essential signals of the RTL design can be obtained according to the relationship between the essential signals, the primary input signals and the non-essential signals in the RTL design. By doing so, we can get runtime values for as many signals as possible in the RTL design.

Other objects, technical contents, features and advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 3 shows an example of RTL instrumentation;

FIG. 5 shows an example of P&R report; and

DETAILED DESCRIPTION OF THE INVENTION

The detailed explanation of the present invention is described as following. The described preferred embodiments are presented for purposes of illustrations and description, and they are not intended to limit the scope of the present invention.

As an illustrative example, FPGA chips may contain three major components: memory blocks and registers (including flip-flops and latches), programmable interconnects, and programmable logic blocks. Memory blocks and registers are used to hold signal values in the user design. Programmable logic blocks are sometimes called look-up tables (LUT), which are essentially static RAM with the input signals as address lines and data output from the RAM as the output signals. By setting up the RAM contents properly, we can turn LUT into various logic gates that we can use to implement combinatorial circuits in the user design. The programmable interconnects are used to program the interconnections among the LUT, the memory blocks and the registers so that the FPGA chip effectively implements the user design (or a portion of the user design) specified by a netlist.

The programmable interconnects can also be viewed as static RAM such that each bit in the RAM controls the shortness or openness of a junction of a pair of wires. Thus, the three major components in an FPGA chip can be viewed together as a large static RAM. To download an image to an FPGA chip is equivalent to set up proper contents for this large static RAM. FPGA vendor provides a way to download images. The opposite of download is "read-back". Many FPGA makers also provide a way for users to read back contents of this large static RAM. Typical methods used for read-back are JTAG, selectMap (Xilinx), etc. At runtime, the LUT contents and the programmable interconnect contents usually stay unchanged. The registers and the memory blocks contents, however, are changing from clock to clock. For debugging, it is very useful to be able to read back registers and memory blocks contents, and more important, correlate the read-back values to hierarchical signal names with respect to the RTL design. By instrumenting user's RTL design, selectively inserting latches in the synthesized gate level design, and analyzing the P&R reports, embodiments disclosed here and their variations offer a solution that enables FPGA-based prototyping systems to provide full visibility for debugging purposes. Embodiments herein disclose exemplary systems and methods that may enable FPGA-based or other prototyping systems to provide good or full visibility for debugging purposes.

Description of Exemplary Embodiments

Figure 1:
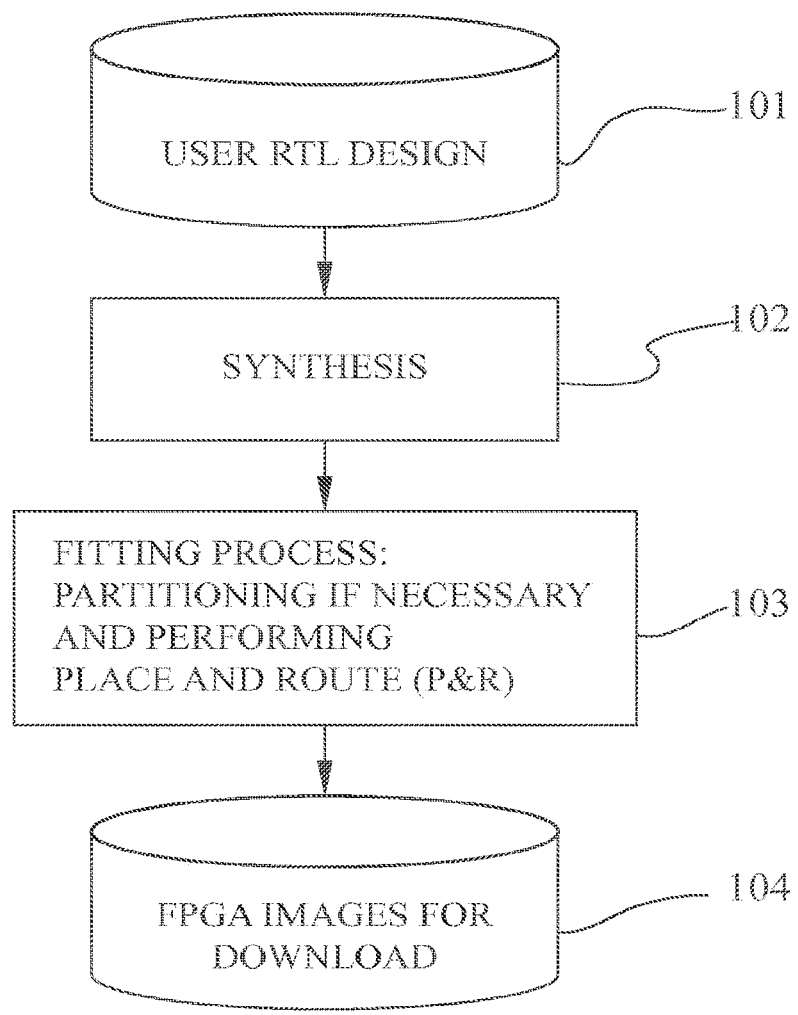
FIG. 1 shows a general flow for in-house built FPGA-based prototyping system.
Figure 2:
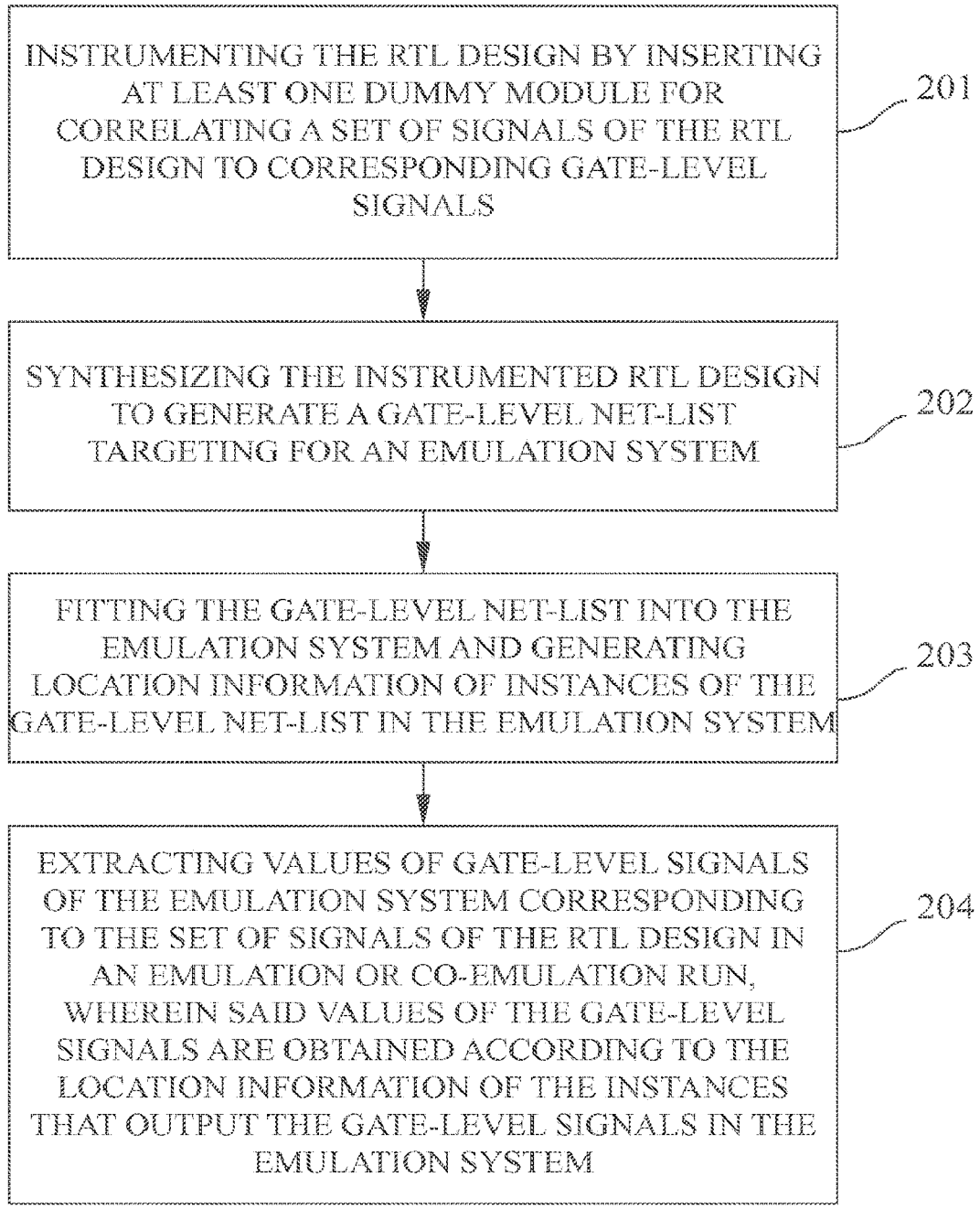
FIG. 2 shows a flow chart to illustrate how RTL signals can be traced in an emulation system.

FIG. 2 shows a flow chart to illustrate how RTL signals can be traced for debugging an RTL design running in an emulation or co-emulation system. First, a set of signals of the RTL design is selected for debugging. Depending on the locations where the RTL signals are declared in the design, dummy modules can be inserted into the original RTL design, that is, the RTL design is instrumented with the dummy modules for correlating the set of signals of the RTL design to corresponding gate-level signals after synthesizing (step 201). Please note that the dummy module is a black box with ports connected to the RTL signals for debugging and it will not be synthesized since there is no real design inside the dummy module, but its presence will be preserved in the gate-level netlist, and it can be used to trace the RTL signals to the corresponding gate-level signals when the gate-level netlist is generated. Then, a synthesizing process is performed on the instrumented RTL design to generate a gate-level netlist targeting for an emulation system (step 202). During the synthesizing process, each of the gate-level signals connected to the ports of the dummy modules will be correlated to a corresponding RTL signal. After the gate-level netlist is generated and the gate-level signals corresponding to the set of the RTL signals are obtained, the gate-level netlist will be fitted into the emulation system and location information of instances of the gate-level netlist in the emulation system can be generated (step 203). At this time, the design is fitted into the emulation system and the mapping between the set of RTL signals and the gate-level signals are known, an emulation run for verifying the RTL design can be started. Please note that the dummy modules will not actually be fitted into the emulation system because they are empty boxes without any real contents. At last, values of gate-level signals of the emulation system corresponding to the set of signals of the RTL design can be extracted in an emulation or co-emulation run, wherein said values of the gate-level signals are obtained according to the location information of the instances that output the gate-level signals in the emulation system (step 204). Please note that, after the gate-level netlist is generated in step 202, a mapping from the names of the set of signals of the RTL design to the names of the corresponding gate-level signals in the netlist can be stored into a database; and the mapping can be read from the database to correlate the names of the set of signals of the RTL design with the names of the corresponding gate-level signals of the emulation system.

FIG. 3 shows an example of RTL instrumentation. Suppose the RTL design contains a module called m1 as shown in block 301, and inside m1 there are two signals r1, r2 which are to be observed at runtime. A new module called "dummy001" is created with two ports, dummy001_s1 and dummy001_s2. Then, in module m1, a new instance of dummy001 is inserted, and the two signals r1 and r2 are connected to it as shown in block 302. This constitutes the instrumented RTL code. During RTL instrumentation, a log file is created in which the relationship between inserted modules and the signals connected to them is described. The example log file as shown in block 303 describes that dummy001 is used to preserve signals declared in instance "top.m1_i.r1", and the first signal connected to it is "top.m1_i.r1" and the second signal "top.m1_i.r2".

Inserted dummy modules are declared as "black boxes" to the RTL synthesizer. For example, module dummy001 is declared as a "black box". Doing so will cause the synthesizer to preserve the module name of the inserted cell (dummy001) and its connectivity in the generated gate level netlist. By analyzing the generated gate level netlist, we can locate dummy001 and the two signals connected to it. By consulting the log file, we know that dummy001 was created to preserve signals "top.m1_i.r1" and "top.m1_i.r2". Thus, we can correlate signals in the synthesized gate level netlist to signals in the RTL design. If module m1 is instantiated in the user design more than once, the RTL design can be "uniquefied" first, and then the RTL instrumentation can be performed to insert a distinct dummy module, such as dummy001, dummy002, dummy003 etc., for each instance of module m1. As a result, each inserted dummy module will be unique In the gate level netlist after synthesizing.

Often the signal names in the generated gate level netlists are renamed from RTL signal names, and bear no resemblance to the original RTL signal names. We have to rely on the aforementioned method to correlate RTL signal names to their corresponding new names in the generated gate level netlist. Then, a log file can be created after synthesizing to describe the mapping of RTL signal names to gate level signal names. For example, the log file contains a mapping as following:

"top.m1_i.r1" "USIG[223]";
"top.m1_i.r2" "USIG[227]";

which means "top.m1_i.r1" is equivalent to gate level signal "USIG[223]" and "top.m1_i.r2" is equivalent to gate level signal "USIG[227]".

Once we locate an inserted dummy module, we can trace the signals that are connected to it. If those signals are originated from latches or registers, then we know we can read back their values at runtime. If those signals are the output of combinatorial cells (i.e. LUT cells), then we may not be able to read back their values at runtime. One way to solve the problem is to insert latches that are always enabled. The inserted latches can get a copy of those signal values at all times. Moreover, the aforementioned method ensures that those corresponding gate level signal names are located at registers output, latches output, or memory blocks, and their values can be read back at runtime.

Figure 4:
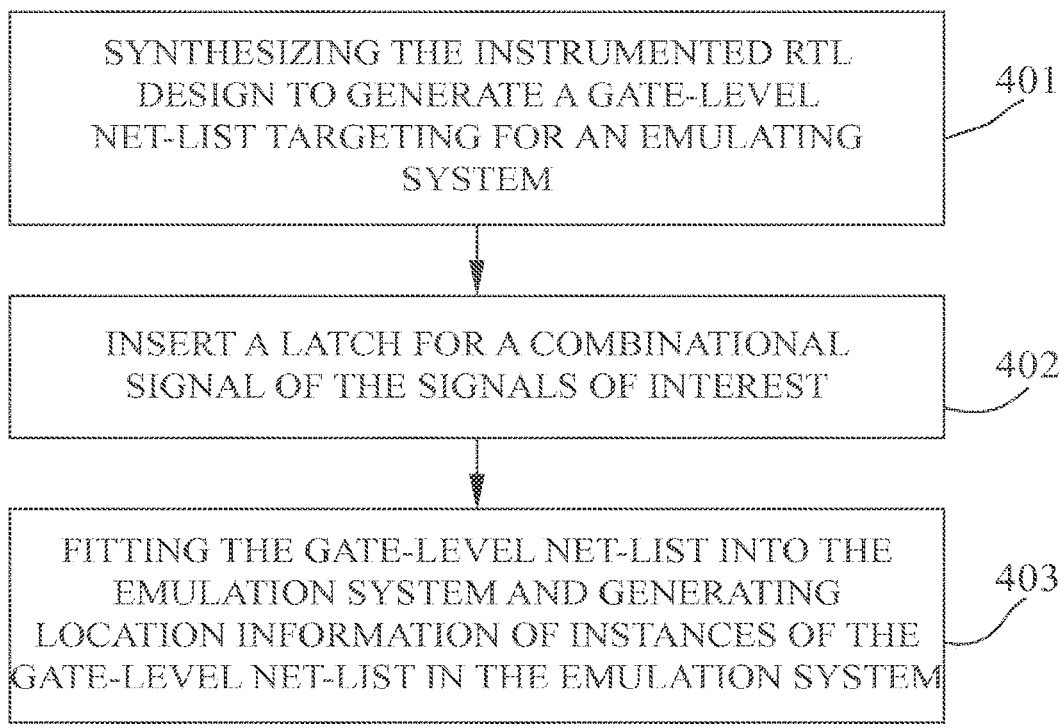
FIG. 4 shows an exemplary flow for inserting a latch for a combinatorial signal

FIG. 4 shows a flow chart to illustrate how a combinatorial signal in the RTL design can be traced and debugged in an emulation or co-emulation system. After the instrumented RTL is synthesized (block 400), if the interesting signals comprise a combinatorial signal, a latch can be inserted to the gate-level netlist for latching the combinatorial signal (block 401), wherein the latch is always enabled so that the value of the output of the latch is equivalent to the value of the combinatorial signal. After the latch is inserted into the gate-level netlist, the gate-level netlist is then fitted into an emulation system (block 402), and then the output of the latch can be read back during an emulation or co-emulation run for debugging the RTL design. Alternatively, a latch, which is always enabled, tor latching the combinatorial signal in the RTL design can be inserted into the RTL design by instrumenting the RTL design before the synthesizing. During synthesis, the inserted latch is specified as an instance to keep in the generated gate-level next-list. Then, the gate-level netlist will contain the latch for debugging the combinatorial signal after the synthesizing.

Finding Signal Locations in FPGA

The emulation system can use a plurality of FPGA devices and the gate-level netlist can be partitioned into the plurality of FPGA devices to fit the gate-level netlist into the emulation system. After the gate level netlists are analyzed and latches are selectively inserted, the resulting netlists are ready for P&R. The P&R tools map instances, ports and nets in a netlist to resources in an FPGA (i.e. I/O butters, memory blocks, registers, LUTs, clock nets, and interconnects). The result is a "bitmap" which can be downloaded to an FPGA to configure the chip to emulate the circuit described by the netlist. The FPGA device provides a read-back mechanism that can be used to read the contents of logic blocks in the FPGA device according to the location information of the instances in the emulation or co-emulation run to obtain the values of the gate-level signals in the emulation or co-emulation run. For debugging purposes, what we need to know is the locations for the memory blocks and registers that the interesting signals are mapped to by the P&R tools. The location information can be obtained by analyzing the report generated by the P&R tools.

FIG. 5 is an example of P&R report. Recalling that an FPGA can be viewed as a large static RAM such that each memory block or register has a unique address, the P&R report use that addressing scheme to describe the locations in the FPGA. The block 501 in FIG. 5 shows that instance USIG[223] is placed at "CLBLL_X4Y119 SLICE_X7Y119"; instance USIG[227] at "CLBLL_X2Y119 SLICE_X3Y119"; and instance USIG[231] at "CLBLM_X3Y119 SLICE_X4Y119". Those "locations" are expressed in the addressing scheme of Xilinx Vertex series FPGAs for an example. Furthermore, the report in FIG. 5 shows that net USIG[223] connects output pin DQ of instance USIG[223] and input pin AX of instance USIG[227], which is shown in block 502; and net USIG[227] connects output pin DQ of instance USIG[227] and input pin AX of instance USIG[231], which is shown in block 503.

Since we know RTL signal top.m1_i.r1 is equivalent to gate level signal USIG[223], if we need the runtime value of top.m1_i.r1, we can get it from the output port of instance USIG[223], which is placed at location CLBLL_X4Y119 SLICE_X7Y119. Based on this location and the DQ output port, we know where to read back from an FPGA and how to extract the bit from the read back data. Thus, all the interesting signals given prior to RTL instrumentation can be located in the FPGAs, and the runtime values can be read back and extracted properly.

Essential Signals for Full Vision

The set of signals of the RTL design in Box 201 in FIG. 2 can include essential signals which are generated by analyzing the RTL design, wherein values of non-essential signals of the RTL design can be obtained according to the relationship between the essential signals, the primary input signals and maybe some other non-essential signals in the RTL design. By doing so, we can get runtime values for as many signals as possible—either by reading back from FPGAs or by re-simulating the netlist based on known signal values for essential signals. "Essential signals" are those signals such that if their values are known, other "non-essential signals" can be derived using various simulation or computation techniques. As an example, U.S. Pat. No. 7,571,086, entitled "Incremental circuit re-simulation system," provide exemplary mechanisms of doing so.

Figure 6A:
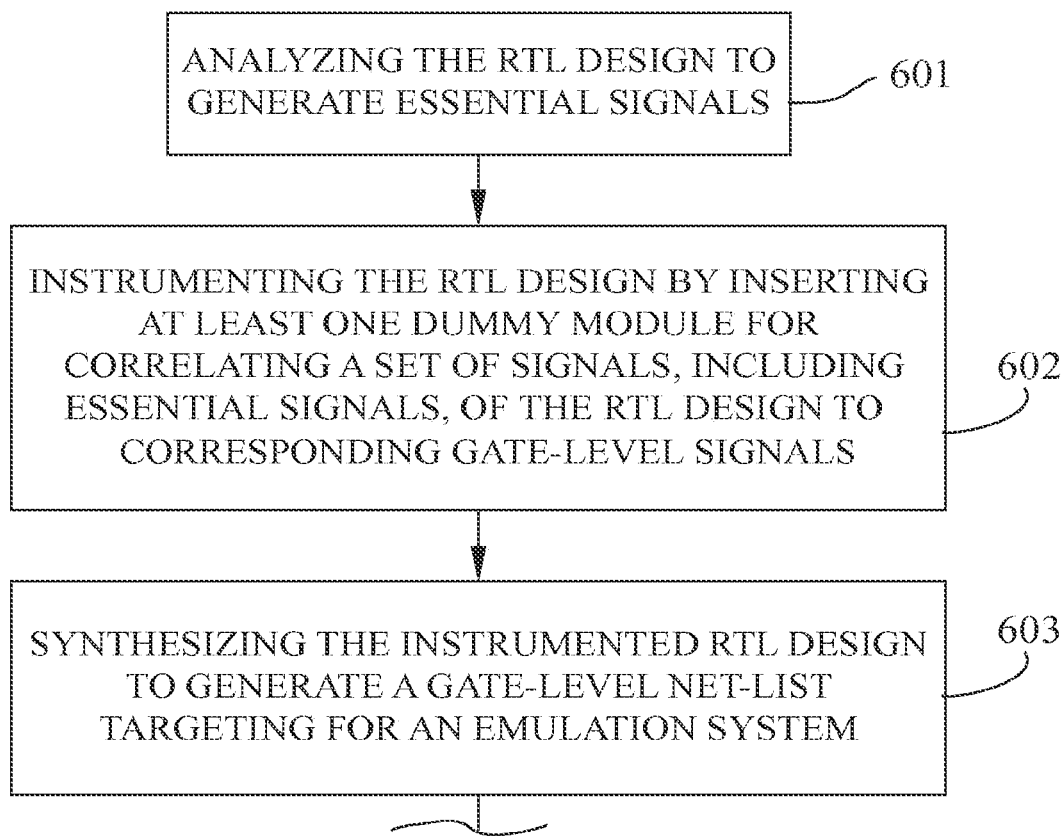
FIG. 6A and 6B shows a flow chart to illustrate how to provide full visibility by tracing essential signals of a RTL design.
Figure 6B:
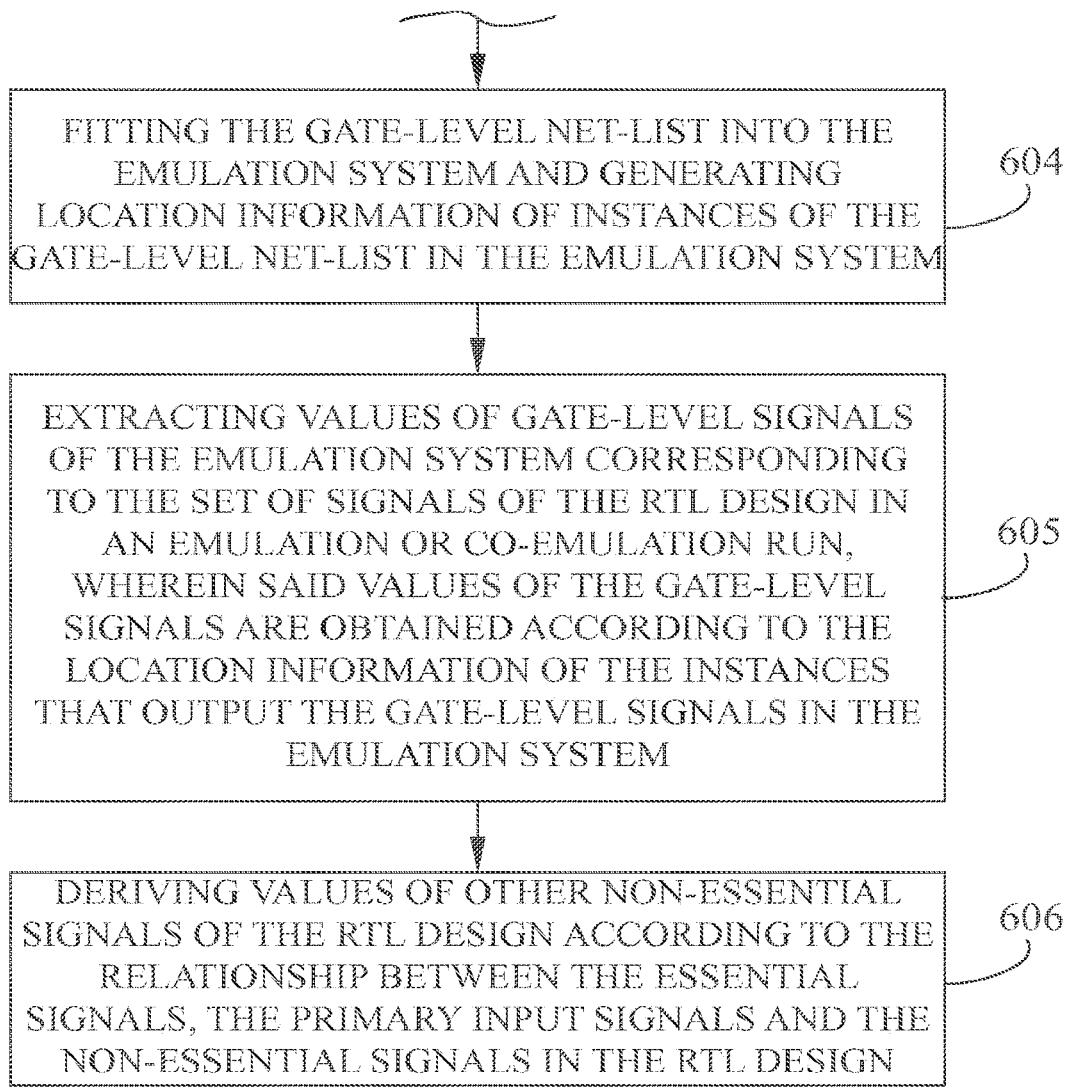

FIG. 6A and FIG. 6B shows an exemplary setup flow consistent with the disclosed embodiments. First, the RTL design is analyzed to generate essential signals (block 600). Then, the steps 602, 603, 604 and 605, which are the same as the steps 201, 202, 203 and 204 in FIG. 2, will be executed so that the values of the essential signals can be obtained at runtime. Other non-essential signals of the RTL design can be obtained according to the relationship between the essential signals, the primary input signals and maybe some other non-essential signals in the RTL design (block 606). Thus, full vision of the RTL signals is achieved.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A method to debug a RTL design in an FPGA-based emulation or co-emulation system, the method comprising the steps of:
   a. instrumenting the RTL design by inserting at least one dummy module for correlating a set of signals of the RTL design to corresponding gate-level signals;
   b. synthesizing the instrumented RTL design to generate a gate-level net-list targeting for the emulation or co-emulation system;

c. fitting the gate-level net-list into the FPGA devices in the emulation or co-emulation system and generating location information of instances of the gate-level net-list in the FPGA devices; and d. extracting values of gate-level signals corresponding to the set of signals of the RTL design in an emulation or co-emulation run according to the location information of the instances that output the gate-level signals in the emulation or co-emulation system.

2. The method of claim 1, wherein the instance name of each dummy module inserted in step a is made distinct in the RTL design, and each dummy module is specified as a black box to the synthesis process in step b.

3. The method of claim 1, wherein FPGA devices in the emulation or co-emulation system provide a read-back mechanism that can be used to read the contents of logic blocks in the FPGA devices according to location information, wherein step d further comprises reading back at least one portion of the contents of logic blocks in an FPGA device to obtain the values of the gate-level signals in the emulation or co-emulation run.

4. The method of claim 1, wherein the set of signals of the RTL design comprises a first signal which is the output of a combinatorial node in the RTL design, wherein step a further comprises instrumenting the RTL design by inserting a first latch, which is always enabled, for latching the first signal.

5. The method of claim 4, wherein FPGA devices in the emulation or co-emulation system provide a read-back mechanism that can be used to read back the contents of logic blocks in the FPGA devices according to the location information, wherein step d further comprises reading back at least one portion of the contents of logic blocks in an FPGA device to obtain the output value of the first latch.

6. The method of claim 1, wherein the set of signals of the RTL design comprises a first signal which is the output of a combinatorial node in the RTL design, wherein the synthesized gate-level net-list generated in step b is inserted with a first latch, which is always enabled, for latching the first signal.

7. The method of claim 1, wherein the set of signals of the RTL design comprises essential signals which are identified by analyzing the RTL design, wherein values of non-essential signals of the RTL design can be obtained according to the relationship between the essential signals, the primary input signals and the non-essential signals in the RTL design.

8. The method of claim 1, wherein step c further comprises generating a mapping from the names of the set of signals of the RTL design to the names of the corresponding gate-level signals in the net-list and storing the mapping into a database; and step d further comprises reading the mapping from the database to correlate the names of the set of signals of the RTL design with the names of the corresponding gate-level signals of the emulation or co-emulation system.

9. The method of claim 1, wherein the emulation or co-emulation system comprises a plurality of FPGA devices, wherein step c further comprises partitioning the gate-level net-list into the plurality of FPGA devices to fit the gate-level net-list into the emulation or co-emulation system.

10. A method to debug a RTL design in an FPGA-based emulation or co-emulation system, the method comprising the steps of:

a. instrumenting the RTL design by inserting at least one dummy module for correlating a set of signals of the RTL design to corresponding gate-level signals;

b. synthesizing the instrumented RTL design to generate a gate-level net-list targeting for the emulation or co-emulation system;

c. fitting the gate-level net-list into the FPGA devices in the emulation or co-emulation system and generating location information of instances of the gate-level net-list in the FPGA devices; and d. extracting values of gate-level signals corresponding to the set of signals of the RTL design in an emulation or co-emulation run according to the location information of the instances that output the gate-level signals in the emulation or co-emulation system and reading a mapping from a database to correlate names of the set of signals of the RTL design with names of the corresponding gate-level signals of the emulation or co-emulation system.

* * * * *